United States Patent [19]

Chan

[11] Patent Number: 4,527,907
[45] Date of Patent: Jul. 9, 1985

[54] METHOD AND APPARATUS FOR MEASURING THE SETTLING TIME OF AN ANALOG SIGNAL

[75] Inventor: Kai Y. Chan, Milpitas, Calif.

[73] Assignee: Fairchild Camera and Instrument Corporation, San Jose, Calif.

[21] Appl. No.: 529,301

[22] Filed: Sep. 6, 1983

[51] Int. Cl.³ .............................................. G04F 8/00
[52] U.S. Cl. .................................. 368/118; 368/120; 324/73 R
[58] Field of Search .............. 368/120, 118; 324/73 R

[56] References Cited

U.S. PATENT DOCUMENTS 4,058,767 11/1977 Muehldorf ........................ 324/73 R
4,161,029 7/1979 Frye et al. ........................ 324/73 R Primary Examiner—Bernard Roskoski
Attorney, Agent, or Firm—Theodore S. Park; Robert C. Colwell

[57] ABSTRACT

Method and apparatus are provided for measuring the settling time, relative to a reference time, of an analog signal having a varying amplitude. The apparatus includes a pair of comparators U1 and U2 for comparing the amplitude of the analog signal with first and second reference signals $V_{Ref1}$ and $V_{Ref2}$. The comparators U1 and U2 are connected to edge detector 22 which supplies a reset signal to a second counter 26 whenever the amplitude of the analog signal is not between the first and second reference signals. Oscillator 32 drives counters 25 and 26 which count pulses from oscillator beginning at the reference time and continuing until the second counter 26 contains a predetermined count. Because the second counter 26 is reset by the edge detector 22 whenever the analog waveform exceeds either of the reference signals, the difference between counter 25 and counter 26 at any subsequent time after the waveform has settled will be the settling time of the analog waveform.

15 Claims, 2 Drawing Figures

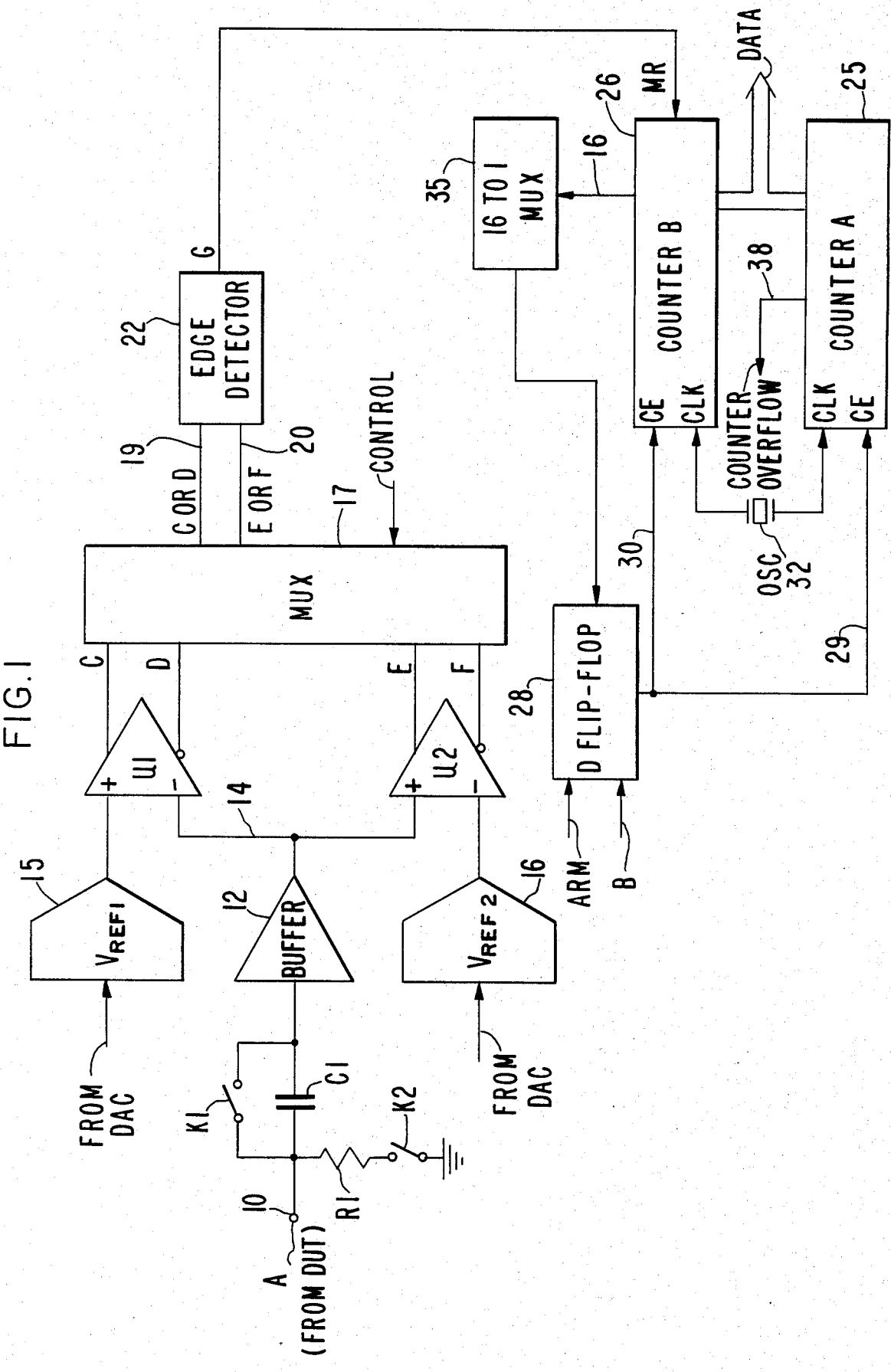

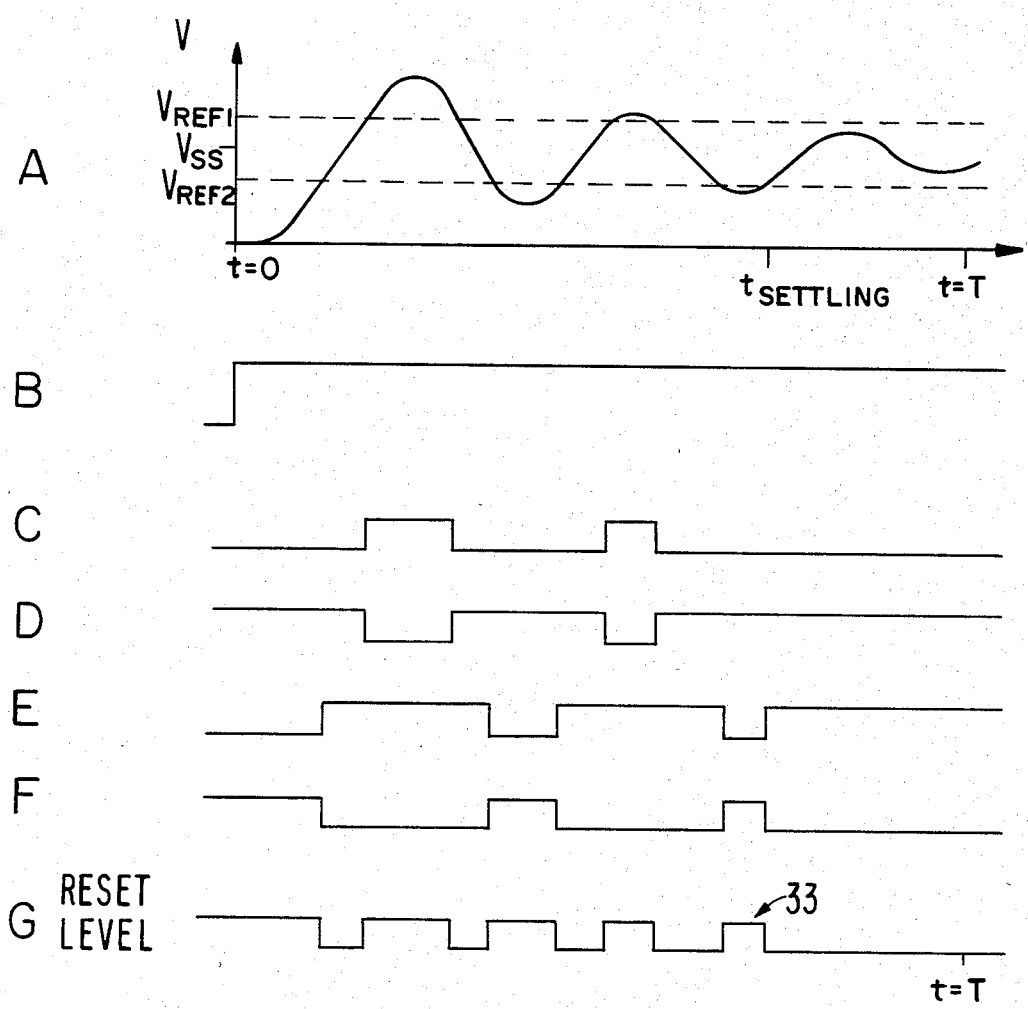

METHOD AND APPARATUS FOR MEASURING THE SETTLING TIME OF AN ANALOG SIGNAL

BACKGROUND OF THE INVENTION

1. Field of the Invention

This invention relates to automatic test equipment for testing integrated circuits and other electronic components, and in particular to a method and apparatus for use in such automatic test equipment to enable measurement of the settling time of an analog signal having a varying amplitude.

2. Description of the Prior Art

Automatic test equipment for the testing of integrated circuits and other electronic components is well known. In the testing of components which produce analog signals, it is frequently desirable to measure the settling time of an analog signal having a varying amplitude. Typically such a signal is generated by supplying an appropriate input signal to the device being tested and then detecting the output signal which results. For many electronic components the resulting output signal will be an oscillating waveform which converges on a steady state value. The settling time, or time required for the oscillating waveform to converge to within a specified band around the desired steady state output signal, is often an important characteristic of the circuit or device being tested.

The conventional prior art approach to measure the settling time of the oscillating waveform has been to display the waveform on an oscilloscope where a skilled person watches the signal and estimates the time required for the signal to converge within a desired band around its ultimate value. This approach, of course, suffers from several disadvantages. It is obviously highly dependent upon the care with which the person involved observes the diminishing waveform, is generally expensive, and is subject to frequent errors, particular where high precision is desired.

Another approach has been suggested in "A New Technique for Testing Settling Time in a Production Environment," by J. Whealler, and published as paper 11.4, 1981 IEEE Test Conference at page 312. This paper also describes the importance of accurately measuring settling time, and describes a technique for measuring settling time. Unfortunately, the technique described requires repeatedly testing the part or component, with each test requiring a special set-up procedure. Furthermore the test procedure itself is time consuming, and generally not suited for use in a production environment.

SUMMARY OF THE INVENTION

This invention provides a reliable and high speed technique for testing components in which the settling time of a varying amplitude analog waveform is to be measured. The apparatus of this invention may be operated under computer control of conventionally available automatic test systems to eliminate the need for viewing the analog signal on an oscilloscope to ascertain its settling time. Furthermore, the settling time may be measured with a very high degree of accuracy because the width of the desired band may be also controlled by the test system computer. The invention is relatively simple to fit to conventional test equipment, and can provide a record of the measured settling time without human intervention.

In one embodiment apparatus for measuring the settling time relative to a reference time of an analog signal having a varying amplitude comprises a comparator for comparing the amplitude of the analog signal with a first and a second reference signal, the comparator supplying a reset signal when the amplitude of the analog signal is not between the first and second reference signals; an oscillator for generating pulses; first and second counters for counting pulses from the oscillator, both counters being enabled at the reference time to begin counting, and the second counter connected to receive the output signal from the comparator to reset counting by the second counter whenever the second output signal is received; and means for detecting the difference in count between the first and the second counters.

In another embodiment a method of measuring the settling time relative to a reference time of an analog signal having a varying amplitude comprises the steps of comparing the amplitude to each of first and second reference signals; generating a reset signal whenever the analog amplitude is not between the first and second reference signals; starting first and second clocks at the reference time; resetting the second clock in response to the reset signal; and measuring the difference between the first and second clocks after the analog signal has settled to thereby determine the settling time.

BRIEF DESCRIPTION OF THE DRAWINGS

FIG. 1 is a diagram illustrating a preferred embodiment of the apparatus of the invention used for measuring the settling time of an analog signal.

FIG. 2 is a timing diagram illustrating a hypothetical analog signal and the resulting signals produced at various locations in the apparatus shown in FIG. 1.

DETAILED DESCRIPTION OF THE PREFERRED EMBODIMENTS

FIG. 1 is a block diagram of a preferred embodiment of the apparatus of this invention. The circuit in FIG. 1 is intended to be coupled to a pin of a device under test in an automatic test system, for example, the Series 80, manufactured by Fairchild Camera and Instrument Corporation, assignee of this patent application. The device under test, in response to various stimuli signals, will provide output signals at selected nodes. The node having an analog signal of varying amplitude whose settling time is to be measured is coupled to the input node 10 shown in FIG. 1. A typical analog signal is shown as waveform A in FIG. 2. The analog signal A in FIG. 2 is generated in response to a step input B, also shown in FIG. 2. The hypothetical waveform A depicted in FIG. 2 generally converges upon a final value $V_{SS}$, and it is desired to measure the settling time ($t_{settling}$) for this waveform. The settling time is defined as the time required for the waveform A to converge into the band defined by $V_{Ref1}$ and $V_{Ref2}$.

As shown by FIG. 1, waveform A from a pin of the device under test (DUT) will be coupled through node 10 to buffer 12. This coupling is achieved by closing or opening switches K1 and K2, depending upon the particular coupling desired. In the preferred embodiment switch K1 will be closed and switch K2 open to thereby directly couple waveform A to buffer 12. For some waveforms K1 will be left open to capacitively couple the signal supplied to node 10 to buffer 12 through capacitor C1. For other signals switch K2 may be closed to pull the signal on node 10 to a desired level.

In embodiments of the invention where more than unity gain is desired, an amplifier may be connected between the DUT and node 10 to provide a desired amount of gain for the signal supplied on node 10. As may be seen by waveform A in FIG. 2, amplifying the analog signal will have the same effect as tightening the band between the reference voltages, thereby enabling more accurate measurement of the settling time.

The waveform emerging from buffer 12 is supplied on line 14 to each of comparators U1 and U2. Each of comparators U1 and U2 is also connected to a reference voltage source 15 and 16, respectively. In the preferred embodiment these reference voltage sources 15 and 16 operate under computer control to provide a desired range of reference voltages. This is achieved in a well-known manner by using the test system computer to control a digital to analog converter, which in turn controls the reference voltages.

In a well-known fashion each of comparators U1 and U2 generate output signals whose state is determined by the relative potential at the comparator input terminals. For example, as shown in FIG. 2, waveform C switches to a high level whenever the reference voltage is exceeded by the potential of the analog waveform A. Waveform D in FIG. 2 is the signal supplied from the inverted output of comparator U1. In a similar manner waveform E, from the normal output of comparator U2, switches to a high level whenever the potential of the analog waveform A exceeds the second reference voltage $V_{Ref\,2}$. Waveform F in FIG. 2 is the signal supplied by the inverted output of comparator U2. The normal and inverted outputs of comparators U1 and U2 are supplied to a multiplexer 17, which, operating under control of the test system computer, switches the desired output signals onto lines 19 and 20 and supplies them to edge detector 22. By installing additional lines and well-known relays, the analog signal from buffer 12 may be supplied to either of the inputs of either of the comparators, as may the reference voltage sources 15 and 16. In this manner any desired reference voltages may be selected to enable desired signals to be supplied by each of the comparators U1 and U2 on either normal or complementary output lines.

Edge detector 22, which comprises two NOR gates, combines the signals received on lines 19 and 20 to produce a waveform G shown in FIG. 2 which is used to control counter 26. As shown by waveform G in FIG. 2, a signal will be supplied to the master reset terminal MR of counter 26 whenever the analog waveform A is greater than the first reference voltage $V_{Ref\,1}$ or smaller than the second reference voltage $V_{Ref\,2}$. This signal will reset counter 26, and cause it to begin counting from zero.

The settling time of the analog signal A shown in FIG. 2 is determined by the apparatus shown in FIG. 1 in the following manner. The waveform B, which is used to cause the device under test to generate the analog signal, is also supplied to a D flip-flop 28. Assuming that flip-flop 28 has been enabled by receipt of an appropriate arming signal indicating a settling time test is to be performed, flop-flop 28 will enable both counters 25 and 26 via lines 29 and 30, respectively. An oscillator 32 connected to the clock terminals of counters 25 and 26 will provide the clock comparators U1 and U2 on either normal or complementary output lines.

Edge detector 22, which comprises two NOR gates, combines the signals received on lines 19 and 20 to produce a waveform G shown in FIG. 2 which is used to control counter 26. As shown by waveform G in FIG. 2, a signal will be supplied to the master reset terminal MR of counter 26 whenever the analog waveform A is greater than the first reference voltage $V_{Ref\,1}$ or smaller than the second reference voltage $V_{Ref\,2}$. This signal will reset counter 26, and cause it to begin counting from zero.

The settling time of the analog signal A shown in FIG. 2 is determined by the apparatus shown in FIG. 1 in the following manner. The waveform B, which is used to cause the device under test to generate the analog signal, is also supplied to a D flip-flop 28. Assuming that flip-flop 28 has been enabled by receipt of an appropriate arming signal indicating a settling time test is to be performed, flop-flop 28 will enable both counters 25 and 26 via lines 29 and 30, respectively. An oscillator 32 connected to the clock terminals of counters 25 and 26 will provide the clock signal to cause the counters to count upward. In the preferred embodiment oscillator 32 oscillates at 500 megaHertz. Thus, both counters A and B will begin counting at $t=0$ shown in FIG. 2. Counter A will continue counting until it is disabled by a signal from D flip-flop 28 through the terminal CE. Counter B, however, will be periodically reset by the signal G supplied to its master reset terminal MR. Thus, after receiving the last reset pulse (pulse 33 in FIG. 2) from edge detector 22, counter A and counter B will count at the same rate. Accordingly, at some subsequent time $t=T$, the contents of counters A and B will differ by a fixed amount indicative of the difference between the settling time and time $t=T$. This difference will remain constant as both counters continue to count at the same rate because counter B will not be reset again. Counter B will not be reset because the waveform A has now converged upon its steady state level $V_{SS}$ within the desired band defined by reference voltages $V_{Ref\,1}$ and $V_{Ref\,2}$.

The operation of counters 25 and 26 can also be stopped by multiplexer 35 which is connected to counter B. Multiplexer 35 detects when counter 26 has reached a preset value. Upon detection of this value a signal is supplied to flip-flop 28 to disable both counters A and B. The contents of counters A and B may then be read out conventionally and the data supplied to other well-known apparatus. The data output is shown schematically in FIG. 1. The particular value which must accumulate in counter B before the counting is stopped by multiplexer 35 will be determined by the expected characteristics of analog waveform A. In particular, multiplexer 35 will be set at a sufficiently high value to provide confidence that the analog waveform has settled, or will not settle.

A count overflow circuit is provided to stop the counting operation should an analog waveform be applied to terminal 10 which does not settle. This feature is achieved by counter A supplying an overflow pulse on line 38 should the counter overflow. This overflow pulse may be detected by circuitry (not shown) and used to generate a failure message with respect to the particular component being tested.

The apparatus shown in FIG. 1 is particularly advantageous because enables the measurement of the settling time of analog waveforms. The apparatus may be readily adapted for use in an automatic test system to permit automatic detection of the satisfactory functionality of components such as digital to analog converters.

I claim:

1. Apparatus for measuring the settling time, relative to a reference time, of an analog signal having varying amplitude comprising:

oscillator means for generating periodic signals;

comparator means for comparing the amplitude of the analog signal with first and second reference signals, the comparator means supplying a reset signal when the amplitude of the analog signal is not between the first and second reference signals;

first and second counting means connected to the oscillator means for counting the periodic signals from the oscillator means, both counting means being enabled at the reference time to begin counting, and the second counting means being connected to receive the reset signal from the comparator means to reset counting by the second counting means whenever the reset signal is received; and means for detecting the difference in count between the first counting means and the second counting means.

2. Apparatus as in claim 1 wherein the comparator means comprises:

first comparator means for comparing the analog signal with the first reference signal; and second comparator means for comparing the analog signal with the second reference signal.

3. Apparatus as in claim 2 wherein the comparator means further comprises:

detector means connected to each of the first and second comparator means for detecting whenever the analog signal is not between the first and second reference signals and supplying the reset signal in response thereto.

4. Apparatus as in claim 2 wherein the comparator means further comprises first and second reference signal generator means for generating the first and second reference signals, respectively.

5. Apparatus as in claim 4 wherein each of the first and second reference signal generator means are adapted to supply a plurality of reference signals.

6. Apparatus as in claim 5 wherein each of the first and second reference signal generator means have input terminals adapted to receive control signals to select one of the plurality of reference signals.

7. Apparatus as in claim 1 further comprising enabling means for controlling the operation of the first and second counting means, the enabling means being connected to receive a reference time signal and in response thereto enable both the first and second counting means.

8. Apparatus as in claim 7 wherein:

the second counting means is adapted to generate a stop counting signal when a pre-selected number of periodic signals have been counted; and the enabling means is also connected to receive the stop counting signal and in response thereto stop both the first and second counting means.

9. Apparatus as in claim 8 wherein the enabling means comprises a flip-flop.

10. A method of measuring the settling time relative to a reference time of an analog signal having varying amplitude comprising:

starting first and second clock means to measure time elapsed since the reference time;

comparing the amplitude of the analog signal to each of first and second reference signals;

generating a reset signal whenever the amplitude is not between the first and second reference signal;

resetting the second clock means in response to the reset signal;

measuring the difference between the first and second clock means after a predetermined period to thereby determine the settling time.

11. A method of measuring as in claim 10 wherein the step of comparing comprises:

supplying the analog signal to each of first and second comparators;

supplying a first reference signal to the first comparator; and supplying a second reference signal to the second comparator.

12. A method as in claim 11 wherein the step of generating comprises:

monitoring output signals from each of the first and second comparators; and supplying the reset signal in response thereto.

13. A method as in claim 12 wherein the step of starting comprises enabling the first and second clock means in response to an initiating signal which initiating signal is also used to initiate variations in the analog signal.

14. A method as in claim 13 wherein the step of measuring comprises stopping both the first and second clock means after the second clock means reaches a predetermined time.

15. A method as in claim 14 wherein the step of measuring further comprises subtracting the time elapsed as measured by the second clock means from the time elapsed as measured by the first clock means to thereby obtain the settling time of the analog signal.

* * * * *